(12) United States Patent
Polster et al.

(10) Patent No.: US 10,696,600 B2
(45) Date of Patent: Jun. 30, 2020

(54) METHOD FOR PRODUCING A CERAMIC COMPONENT COMPOSED OF A PLURALITY OF JOINED PREFORMS AND COMPONENT OBTAINED BY THE METHOD

(71) Applicant: SGL CARBON SE, Wiesbaden (DE)

(72) Inventors: Peter Polster, Meitingen (DE); Andreas Kienzle, Meitingen (DE); Thomas Putz, Meitingen (DE); Albin Von Ganski, Meitingen (DE); Blasius Hell, Meitingen (DE); Alfred Haeusler, Meitingen (DE)

(73) Assignee: SGL Carbon SE, Wiesbaden (DE)

( * ) Notice: Subject to any disclaimer, the term of this patent is extended or adjusted under 35 U.S.C. 154(b) by 363 days.

(21) Appl. No.: 15/497,422

(22) Filed: Apr. 26, 2017

(65) Prior Publication Data
US 2017/0226020 A1    Aug. 10, 2017

Related U.S. Application Data

(60) Division of application No. 14/058,432, filed on Oct. 21, 2013, now abandoned, which is a continuation of
(Continued)

(51) Int. Cl.
*B32B 37/00* (2006.01)
*C04B 35/00* (2006.01)
(Continued)

(52) U.S. Cl.
CPC ............ *C04B 37/008* (2013.01); *B32B 37/14* (2013.01); *C04B 35/522* (2013.01);
(Continued)

(58) Field of Classification Search
CPC ......... B32B 37/00; B32B 37/10; B32B 37/14; C04B 35/00; C04B 35/50; C04B 35/52;
(Continued)

(56) References Cited

U.S. PATENT DOCUMENTS 4,740,535 A * 4/1988 Iyer ....................... B22C 1/2253
523/145
5,942,064 A * 8/1999 Krenkel ............... C04B 37/005
156/89.25
(Continued)

FOREIGN PATENT DOCUMENTS

DE          19636223 C2      3/1998
DE          19837768 A1      3/2000
(Continued)

*Primary Examiner* — Seyed Masoud Malekzadeh
*Assistant Examiner* — Matthew Hoover
(74) *Attorney, Agent, or Firm* — Laurence A. Greenberg; Werner H. Stemer; Ralph E. Locher

(57) ABSTRACT

A method for producing a component includes a) providing at least two preforms each made of a carbon composite material, b) joining the at least two preforms at least at one respective connecting surface to form a composite, in which a joining compound is introduced between the joining surfaces of the preforms and then cured and the joining compound contains silicon carbide and at least one polymer adhesive, and c) siliconizing the composite to form the component. A component, such as an optical component produced thereby, is also provided.

20 Claims, 5 Drawing Sheets

Related U.S. Application Data application No. PCT/EP2012/053869, filed on Mar. 7, 2012.

(51) Int. Cl.
| | | |
|---|---|---|
| C04B 37/00 | (2006.01) | |
| C09J 5/00 | (2006.01) | |
| C09J 11/00 | (2006.01) | |
| C09J 161/00 | (2006.01) | |
| G03F 7/00 | (2006.01) | |
| C04B 35/634 | (2006.01) | |
| C04B 35/52 | (2006.01) | |
| C04B 35/573 | (2006.01) | |
| C04B 35/636 | (2006.01) | |
| C04B 35/83 | (2006.01) | |
| C04B 35/626 | (2006.01) | |
| B32B 37/14 | (2006.01) | |
| G03F 7/20 | (2006.01) | |
| C09J 5/02 | (2006.01) | |
| C09J 11/04 | (2006.01) | |
| C09J 161/04 | (2006.01) | |

(52) U.S. Cl.
CPC ........ *C04B 35/573* (2013.01); *C04B 35/6263* (2013.01); *C04B 35/6269* (2013.01); *C04B 35/6365* (2013.01); *C04B 35/63476* (2013.01); *C04B 35/83* (2013.01); *C04B 37/005* (2013.01); *C09J 5/02* (2013.01); *C09J 11/04* (2013.01); *C09J 161/04* (2013.01); *G03F 7/7095* (2013.01); *C04B 2235/3826* (2013.01); *C04B 2235/428* (2013.01); *C04B 2235/48* (2013.01); *C04B 2235/483* (2013.01); *C04B 2235/526* (2013.01); *C04B 2235/5248* (2013.01); *C04B 2235/5296* (2013.01); *C04B 2235/5436* (2013.01); *C04B 2235/604* (2013.01); *C04B 2235/612* (2013.01); *C04B 2235/616* (2013.01); *C04B 2235/96* (2013.01); *C04B 2235/9607* (2013.01); *C04B 2237/083* (2013.01); *C04B 2237/363* (2013.01); *C04B 2237/385* (2013.01); *C04B 2237/52* (2013.01); *C04B 2237/61* (2013.01); *C04B 2237/66* (2013.01); *C04B 2237/78* (2013.01); *C04B 2237/80* (2013.01); *C04B 2237/82* (2013.01); *C04B 2237/86* (2013.01); *C09J 2203/10* (2013.01); *C09J 2400/10* (2013.01); *C09J 2400/126* (2013.01); *C09J 2401/008* (2013.01); *C09J 2461/00* (2013.01); *C09J 2461/008* (2013.01); *Y10T 156/10* (2015.01)

(58) Field of Classification Search
CPC ..... C04B 35/522; C04B 35/57; C04B 35/573; C04B 35/60; C04B 35/62; C04B 35/626; C04B 35/6263; C04B 35/6269; C04B 35/63; C04B 35/634; C04B 35/6347; C04B 35/63476; C04B 35/636; C04B 35/6365; C04B 35/80; C04B 35/83; C04B 37/00; C04B 37/005; C04B 37/008; C09J 5/00; C09J 5/02; C09J 11/00; C09J 11/04; C09J 161/00; C09J 161/04; G03F 7/00; G03F 7/70; G03F 7/709; G03F 7/7095

See application file for complete search history.

(56) References Cited

U.S. PATENT DOCUMENTS

| 2002/0070485 A1* | 6/2002 | Odaka ................. C04B 35/573 264/682 |
|---|---|---|
| 2003/0117730 A1 | 6/2003 | Kroedel et al. |
| 2008/0131665 A1* | 6/2008 | Suyama ................. B82Y 30/00 428/149 |
| 2013/0106010 A1 | 5/2013 | Kienzle et al. |

FOREIGN PATENT DOCUMENTS

| DE | 10035111 A1 | 10/2001 |
|---|---|---|
| DE | 10 2011007815 | * 4/2011 |
| EP | 1262801 A1 | 12/2002 |
| EP | 1930306 A1 | 6/2008 |
| WO | 2011161267 A1 | 12/2011 |

* cited by examiner

METHOD FOR PRODUCING A CERAMIC COMPONENT COMPOSED OF A PLURALITY OF JOINED PREFORMS AND COMPONENT OBTAINED BY THE METHOD

CROSS-REFERENCE TO RELATED APPLICATION

This is a divisional application of U.S. patent application Ser. No. 14/058,432, filed Oct. 21, 2013, which was a continuation, under 35 U.S.C. § 120, of copending International Application No. PCT/EP2012/053869, filed Mar. 7, 2012, which designated the United States; this application also claims the priority, under 35 U.S.C. § 119, of German Patent Application DE 10 2011 007 815.0, filed Apr. 20, 2011; the prior applications are herewith incorporated by reference in their entirety.

BACKGROUND OF THE INVENTION

Field of the Invention

The present invention relates to a method for producing a component, particularly a component made of ceramic and a component, such as an optical component, produced thereby.

Ceramic components are used in various technical fields, for example the electrical industry, automotive engineering and medical engineering. In fields of that kind, silicon carbide (SiC) is often added to technical ceramic materials, and particularly if they are constructed for applications in which the material is exposed to conditions requiring exceptional hardness and resistance to heat. In order to produce such a ceramic component, a molded element made from a carbon-containing starting material may undergo a siliconizing process, for example, in which the carbon is reacted with silicon supplied from the outside to yield silicon carbide, and optionally pores that are present in the molded element or form therein are filled with pure silicon. In the latter case, in which the pores of a molded element are infiltrated with silicon, a molded element of silicon-infiltrated silicon carbide (SiSiC) is obtained, which is distinguished in that it has practically no residual porosity. Alternatively, components of the type described may also be prepared in a sintering process using silicon carbide in powder form.

In certain applications, particularly in the field of optical lithography, ceramic components are required that have a precisely defined shape and particularly homogeneous material properties with regard to the component volume. However, it is difficult or even impossible to manufacture components from SiSiC or other sintered ceramics with the necessary precision and uniformity, particularly larger components with dimensions greater than 500 mm×500 mm×500 mm. That is particularly true if the component to be manufactured has a relatively complicated shape. Moreover, quite significant shrinkage occurs, particularly during sintering.

In general, larger components can also be produced by assembling smaller individual components to create a larger, complete component. In such an approach, however, the individual components must be joined to each other firmly and reliably.

A method for joining at least two components made of carbon fiber reinforced plastic using a paste of an organic binder and carbon powder is known From German Patent DE 196 36 223 C2, corresponding to U.S. Pat. No. 5,942,064. In that context, the paste is pyrolyzed at a temperature of from 800° C. to 1200° C., which causes a microcrack system to form in the paste due to shrinkage. During subsequent siliconizing of the complete component silicon infiltrates both the microcracks in the paste and microcracks in the carbon fiber reinforced plastic, and may thus react with the carbon fibers of the components and with the carbon powder of the paste to form silicon carbide.

However, the chemical reaction between the carbon and the silicon, as well as any side reactions, that takes place in the joining layer between the two components presents difficulties with regard to the homogeneity of the complete component being produced. Since plastic-bonded carbon fibers are present in the individual components themselves, but carbon powder is distributed in an organic binder in the paste of the joining layer, differing reaction behaviors inevitably occur during siliconizing, which ultimately results in inconsistencies in the end material and undesirable shrinkage.

SUMMARY OF THE INVENTION

It is accordingly an object of the invention to provide a method for producing a ceramic component composed of a plurality of joined preforms and a component obtained by the method, which overcome the hereinafore-mentioned disadvantages of the heretofore-known methods and components of this general type and in which the method is used for producing components, particularly ceramic components such as those based on SiSiC, with which components may be obtained that exhibit greater homogeneity in terms of their properties, in particular smaller density variations and reduced shrinkage, than the known components, in particular even when such components are relatively large and have a complex or complicated shape.

With the foregoing and other objects in view there is provided, in accordance with the invention, a method for producing a component, in particular a ceramic component, which comprises the following steps:

providing at least two preforms, each from a carbon composite material, connecting the at least two preforms through at least one joining surface on each to form a composite, by introducing a joining compound between the joining surfaces of the preforms, which compound is then cured, wherein the joining compound contains silicon carbide and a polymer adhesive, and siliconizing the composite to produce the component.

According to the invention, the component to be produced from multiple individual components or preforms of carbon composite material is thus combined to yield a complete component or composite, wherein the individual components are bonded to each other and the complete component undergoes a siliconizing process. By assembling the component from a plurality of individual components, it is possible to produce even relatively large components with relatively complex shapes quite simply.

During the thermal treatment of the joining compound in step c), the adhesive polymer contained therein is broken down due to the significant effect of the embedded silicon particles, with the result that pores are formed through which silicon is able to infiltrate the joining layer in step c). However, the silicon does not react with the silicon carbide present in the joining layer, so the silicon carbide in the joining layer functions as a passive porosity creator that promotes the penetration by silicon into the joining layer during step c), but is not itself involved in the reaction. Consequently, after the completion of step c) silicon and silicon carbide are both present in the joining layer. Thus, the end result is the production of a homogeneous composite component based on a silicon carbide ceramic.

Since the silicon carbide does not itself react in the joining compound, but merely functions as a non-reacting filler for creating porosity, it helps in avoiding those undesirable reactions that result in inhomogeneities in the final material and increased shrinkage in the known production methods. In this context, it is particularly advantageous that the porosity forming substance in the joining compound has the same properties as the substance produced in the preforms during siliconization because both of the substances are silicon carbide. This makes it possible to manufacture even relatively large and complex components with a high degree of precision and homogeneity in the manner described. In particular, undesirable density gradients are avoided in the composite that is siliconized to form the component. In addition, variation in material properties, such as thermal conductivity, modulus of elasticity and flexural strength, are also kept low as a result of the method according to the invention.

For the purposes of the present invention, a composite material is understood to be a material formed of two or more bonded components, wherein the composite material has different material properties from its individual components. This term thus particularly applies to both carbon composites and sintered SiC.

For the purposes of the present invention, a carbon composite material is understood to be one in which particles and/or fibers of carbon are embedded in a matrix.

Additionally for the purposes of the present invention, ceramic is very generally understood to be a technical material that is obtained by molding from inorganic starting material and subsequent heat treatment, wherein the heat treatment is carried out at a temperature at least 50° C. below the melting temperature of the material.

In general, the method according to the invention is not limited with regard to the way in which the joining compound is introduced between the joining surfaces of the surfaces of the preforms and subsequently cured. For example, the joining compound may be applied to a joining surface of a preform in step b) before the joining surface coated in this way is pressed against the joining surface of another preform and the joining compound is then cured. In this embodiment, the joining compound is preferably provided in the form of a paste to enable easy application—for example with a brush or an application blade. The pressing together of the two preforms in conjunction with the curing of the joining compound produces a bond that is stable and extremely durable.

Alternatively, the preforms to be joined may be aligned with one another in step b), optionally with a joining device, so that a bonding gap is formed between the joining surfaces, the bonding gap is filled with the joining compound afterwards, and the joining compound is then cured. The advantage of this procedure is that the bonding gap may be set to precisely defined dimensions, particularly thickness. The joining surfaces may optionally be pressed against each other before the joining compound cures, in order to increase the strength of the bond. In this context, the procedure for joining the preforms is dependent on the respective application. In particular, the preforms may be brought together so that their large areas are flush with one another, or edge to edge, or with the aid of joining devices if it is not possible to apply angular pressing force to the joining surfaces. Accordingly, it is also possible to perform joining operations with separating seams that extend multi-axially. The separating seams are preferably selected in such a way that areas under load do not pass through a joining surface.

In the context of the present invention, it has also proven advantageous for a joining compound to be used in step b) that includes a phenolic resin as the polymer adhesive. Alternatively or in addition thereto, the joining compound may include a carbon-free polymer, preferably a polysilane, a polysiloxane, a polysilazane or any mixture of two or more of the aforementioned compounds as the polymer adhesive. Carbon-free polymers have the advantage that they do not react with carbon in the joining layer during subsequent process steps.

An easily manufactured joining compound with a viscosity that lends itself well to being applied is produced, for example, when the polymer adhesive is suspended in water.

The present invention is not limited with regard to the proportions of the individual ingredients in the joining compound. However, good results are obtained particularly when in step b) a joining compound is used that contains 5 to 50% by weight of water, 20 to 80% by weight of silicon carbide and 10 to 55% by weight of polymer adhesive. Particularly preferably, a joining compound is used in step b) that contains 10 to 40% by weight of water, 30 to 65% by weight of silicon carbide and 20 to 45% by weight of polymer adhesive, and particularly preferred is a joining compound containing 15 to 25% by weight of water, 45 to 55% by weight of silicon carbide and 27 to 33% by weight of polymer adhesive. According to an embodiment that has proven most particularly advantageous, the joining compound contains 20% by weight of water, 50% by weight of silicon carbide and 30% by weight of polymer adhesive, preferably phenolic resin.

A curing agent for the polymer adhesive may also be provided in the joining compound, with such curing agent preferably being liquid. The curing agent is preferably not added to the joining compound until immediately before the joining compound is applied to the joining surface, in order to make quite sure that the adhesive polymer does not begin curing prematurely. The joining compound thus functions as a two-component adhesive. This makes it possible to dispense with thermal curing of the joining compound, and the composite thus does not need to be placed in an kiln to cure the joining compound. This represents a significant advantage, since the provision of a kiln to accommodate the composite is associated with a great deal of effort and correspondingly high costs, particularly in the case of larger components.

Any substance that causes the adhesive polymer used to cure may serve as the curing agent for the joining compound. Examples of such are bases and preferably acids. In this context, in principle all known bases and acids may be used, including alkaline metal hydroxides, alkaline earth metal hydroxides, mineral acids such as sulphuric acid, nitric acid, phosphoric acid, and organic acids, for example carboxylic acids such as acetic acid, trifluoroacetic acid or trichloroacetic acid. Particularly good results, are obtained when p-toluenesulfonic acid is used as the curing agent, particularly if a phenolic resin is used as the polymer adhesive.

In a further development of the concept of the invention, it is suggested to carry out the curing of the joining compound in step b) at a temperature of 10° C. to 100° C., preferably from 15° C. to 80° C. and particularly preferably from 18° C. to 30° C., wherein the curing may be carried out, for example, for a period of 5 to 30 hours. From a process engineering point of view, curing at room temperature is advantageous. If some of a plurality of joining surfaces or certain points on joining surfaces require accelerated curing, the corresponding areas may also be heated selectively to cure them.

According to another preferred embodiment of the present invention, a joining compound is used in step b) that contains silicon carbide in powder form and has an average particle diameter of 1 to 50 µm, preferably 3 to 20 µm, and particularly preferably of 5 to 10 µm. The use of silicon carbide powder with the indicated particle sizes has been found to be particularly favorable, especially with regard to the intended effect.

In order to enable controlled assembly of the preforms and a high load capacity of the adhesive joint, in step b) the joining surfaces of the preforms between which the joining compound is provided are pressed against each other by a clamping device, with the contact pressure being preferably 0.5 to 4 MPa and particularly preferably 1 to 2 MPa.

It has also been found in the context of the present invention that components having particularly advantageous properties may be produced when in step a) at least two preforms are provided from a composite material having a matrix of amorphous and porous carbon. Such preforms of C/C, that is to say of composites in which carbon particles and/or fibers are embedded in a matrix of amorphous and porous carbon, may particularly be provided in the form of a green body, which is dimensionally stable but still easily machinable.

According to the invention carbon particles and/or carbon fibers are embedded in the matrix of amorphous and porous carbon, and it is preferable if the particle diameter of the carbon particles or the average length of the carbon fibers is not more than 75 µm, and preferably not more than 50 µm. It has proven advantageous to avoid fiber materials with longer fibers.

In this context, the preforms made from a carbon composite material may be provided in step a) in any manner known to a person skilled in the art. For example, in order to provide at least two preforms made of a composite material with a matrix of amorphous and porous carbon in step a), at least two preforms may be molded from a mixture containing a carbon precursor and an organic binder before they are carbonized and if necessary graphitized.

In particular, in this embodiment a mixture containing the carbon precursor and an organic binder may be molded into at least two panel-like raw slabs before the slabs are pressed to make preforms, each having a density from 0.5 g/cm³ to 1.5 g/cm³, in one or more compaction cycles.

In a refinement of the concept of the invention, it is suggested to carbonize the preforms at a temperature of from 600° C. to 1,500° C., preferably from 800° C. to 1,200° C., and particularly preferably from 850° C. to 950° C. According to a particularly preferred embodiment, carbonization is carried out at 900° C. for example.

Should the application require it, after carbonization it is possible to perform graphitization at a temperature from 1,600° C. to 2,500° C., preferably from 1,800° C. to 2,200° C., and particularly preferably from 1,900° C. to 2,100° C. A temperature of 2000° C. has been found to be particularly favorable for carrying out graphitization.

In principle, all compounds containing carbon known to a person skilled in the art that can be pyrolyzed, carbonized or graphitized easily and as completely as possible to yield carbon may be used as the carbon precursor in the process according to the invention. Examples of such compounds include pitch and polyacrylonitrile.

According to a particularly preferred embodiment of the present invention, cellulose flour is used as the carbon precursor. Cellulose flour in this context is understood to mean finely ground cellulose, the particles of which have a diameter, or in the case of a non-spherical shape a longest dimension, not exceeding 50 µm. In this embodiment, the provision of the preforms in step a) preferably includes the following steps:
  providing cellulose flour,
  carbonizing the cellulose flour,
  mixing the carbonized cellulose flour with a binder, preferably a phenolic resin,
  molding at least two preforms, for example in the form of panels, from the mixture prepared in step 3),
  optionally, pressing the at least two preforms molded in step 4),
  carbonizing the at least two preforms, and
  optionally graphitizing the at least two carbonized preforms.

One advantage of the use of cellulose powder resides in that, surprisingly, it produces a preform having relatively high porosity, of 70% for example. Moreover, a relatively high proportion of cellulose flour reacts with silicon to form silicon carbide, so that a relatively large number of silicon carbide bridges are formed during siliconization.

In a refinement of the concept of the invention, it is suggested to use carbonized cellulose flour in which the carbon particles have an average aspect ratio of at most 80:1 and preferably not more than 50:1. In this context, the term aspect ratio is understood to be the ratio of the maximum elongation of a particle to the minimum elongation of the same particle, in other words, in the case of fibers for example, the ratio of fiber length to fiber diameter. Such carbon particles with relatively low aspect ratio are favorable to the goal of high porosity.

According to a further preferred embodiment of the present invention, the composite produced in step b) is machined in its entirety, for example by milling, grinding or cutting, prior to siliconizing. This is relatively easy to do, because the composite has not yet reached its final hardness. Such machining with the machined body in a relatively soft state is also called "green machining." If the composite is machined as a whole, the component shape may be adapted accurately across the joining seams. If it should be necessary due to the complexity of the component to be produced, finished green machined preforms may also be assembled and machined subsequently in the green state as a composite of certain, for example, dimensionally critical zones. Such a procedure may also be used, for example, in the production of housing components that can no longer be machined on the inside in the final state thereof. In this case, the interior sections are machined before they are joined, which is to say machining is carried out on the individual parts. Similarly, separation points may be provided on the sections of the component on which green machining of the composite is no longer possible due to the construction of the corresponding processing machines. The provision of suitable separation points may also be helpful if the traverses of a tool in the respective machining center are not sufficient.

Accordingly, depending on requirements at least one and preferably all of the preforms may be machined before step b), and the preforms that are joined to form the composite may be machined as a whole again after step b) and before step c). Further, the preforms that are joined in step b) may joined to at least one more preform made from a carbon composite material in another step b) after machining and before siliconizing.

Thus, the following steps, for example, may be carried out in order to produce a particularly complex component:

Performing a first green machining operation on a plurality of particularly panel-like preforms, Assembling the preforms to make multiple composites, Performing a second green machining operation on the composites, and Joining a plurality of fully or partly machined composites to form a finished component.

In order to seal the pores on the joining surfaces of the preforms and thereby improve the adhesion of the subsequently applied joining compound, in step b) a pretreatment compound may be applied to the joining surfaces of the preforms before the joining compound is introduced.

Such a pretreatment compound may contain silicon carbide, in particular. The pretreatment compound is preferably constituted of the same components as the joining compound. In this way, an increase in inhomogeneities in the manufactured component due to the use of the pretreatment compound may be avoided.

The pretreatment compound preferably has a lower viscosity than the joining compound.

In general, the composite may be siliconized to produce the component in step c) in any way known to a person skilled in the art. For example, siliconization of the composite to form the component may be carried out in step c) by infiltrating the composite with liquid silicon or a liquid silicon alloy followed by heat treatment at a temperature from 1,100 to 2,000° C., preferably from 1,350 to 2,000° C., and particularly preferably from 1,500° C. to 1,700° C. An alloy selected from the group consisting of the silicides of iron, chromium, titanium, molybdenum, nickel and aluminum, for example, may be used as the silicon alloy. Heat treatment while silicon is added causes at least part of the carbon in the composite to be converted to silicon carbide.

With the objects of the invention in view, there is also provided a component producible by a method described in the preceding.

The component according to the invention preferably has a thermal conductivity measured in accordance with DIN (German Industrial Standard) EN 821-2 from 80 to 190 mW/m·K and preferably from 130 to 180 mW/m·K.

As was explained in the preceding, the method according to the invention lends itself particularly well to the production of relatively large components with a particularly high degree of homogeneity, that is to say with very low variation in density and little variation in material properties over the volume of the component. For this reason, according to a further preferred embodiment of the present invention the device according to the invention has a length of at least 200 mm, preferably at least 400 mm and particularly preferably at least 600 mm. For example, a particularly preferred embodiment of the invention provides that the dimensions of the component are 1150 mm×600 mm×390 mm.

With the objects of the invention in view, there is concomitantly provided a component as described in the preceding as an optical component, particularly a component in optical lithography.

Other features which are considered as characteristic for the invention are set forth in the appended claims.

Although the invention is illustrated and described herein as embodied in a method for producing a ceramic component composed of a plurality of joined preforms and a component obtained by the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1A:
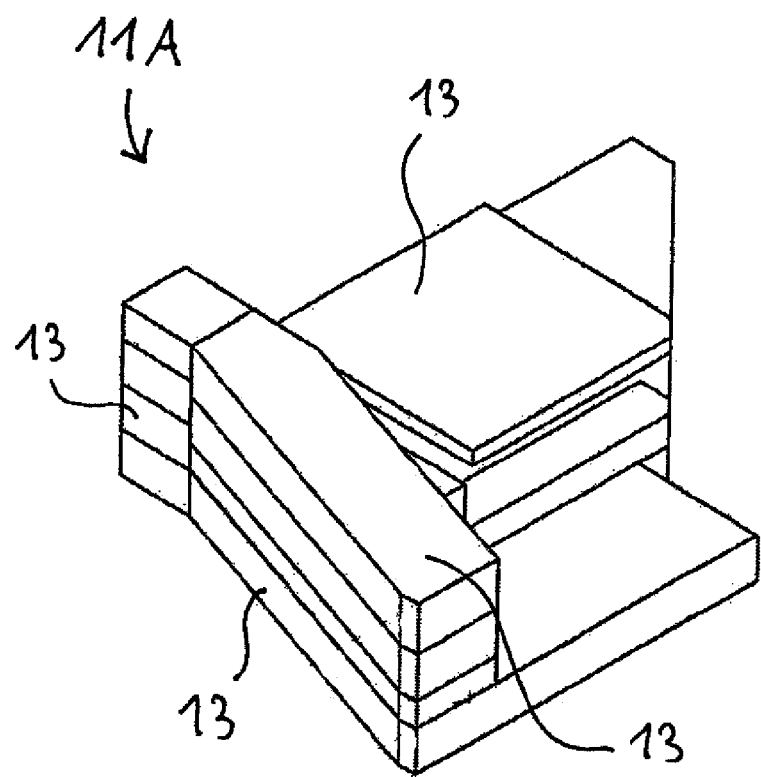
FIG. 1A is a diagrammatic, perspective view of a first segment of a component according to the invention.
Figure 1B:
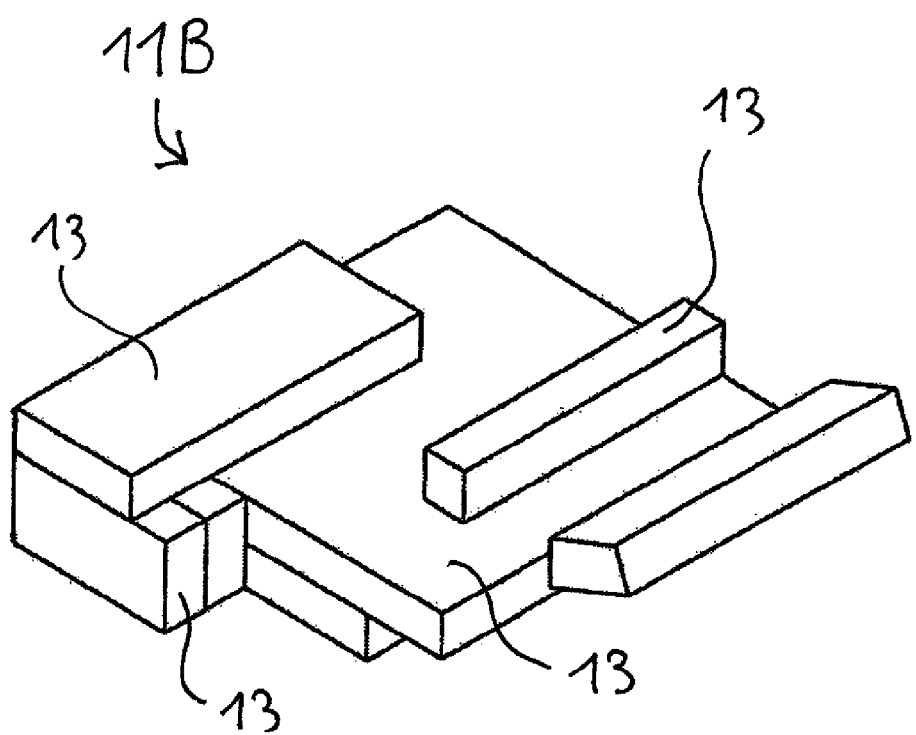
FIG. 1B is a perspective view of a second segment of a component according to the invention.
Figure 1C:
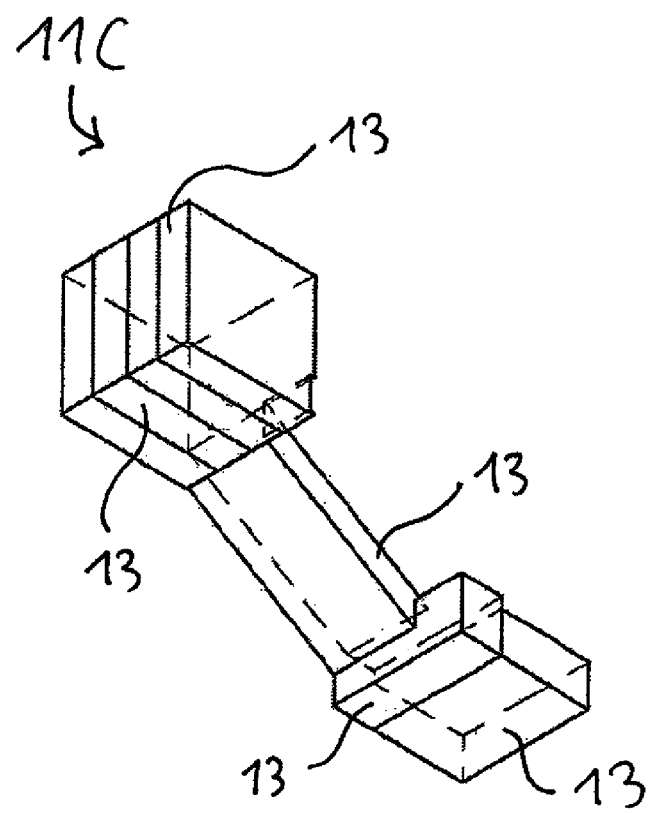
FIG. 1C is a perspective view of a third segment of a component according to the invention.
Figure 2:
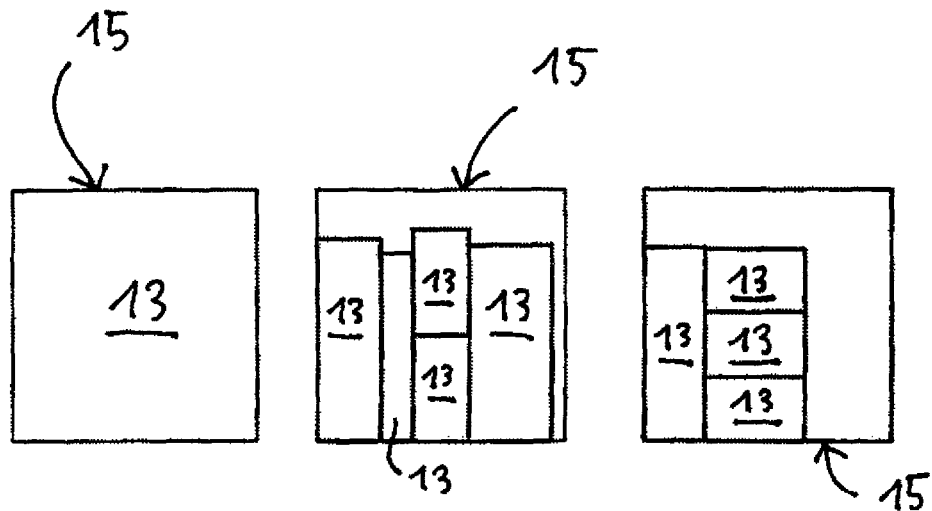
FIG. 2 is a plan view illustrating a plan for cutting preforms out of panel-like starting elements, in which the preforms are to be assembled to form a composite as part of a method according to the invention.
Figure 1D:
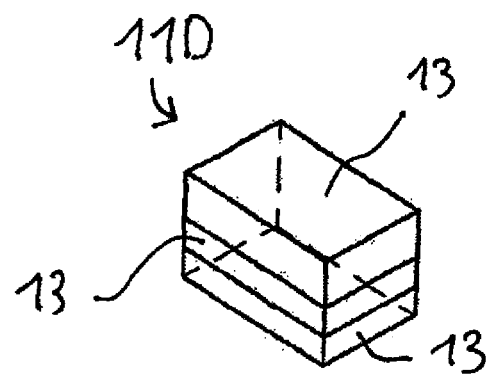
FIG. 1D is a perspective view of a fourth segment of a component according to the invention.
Figure 3:
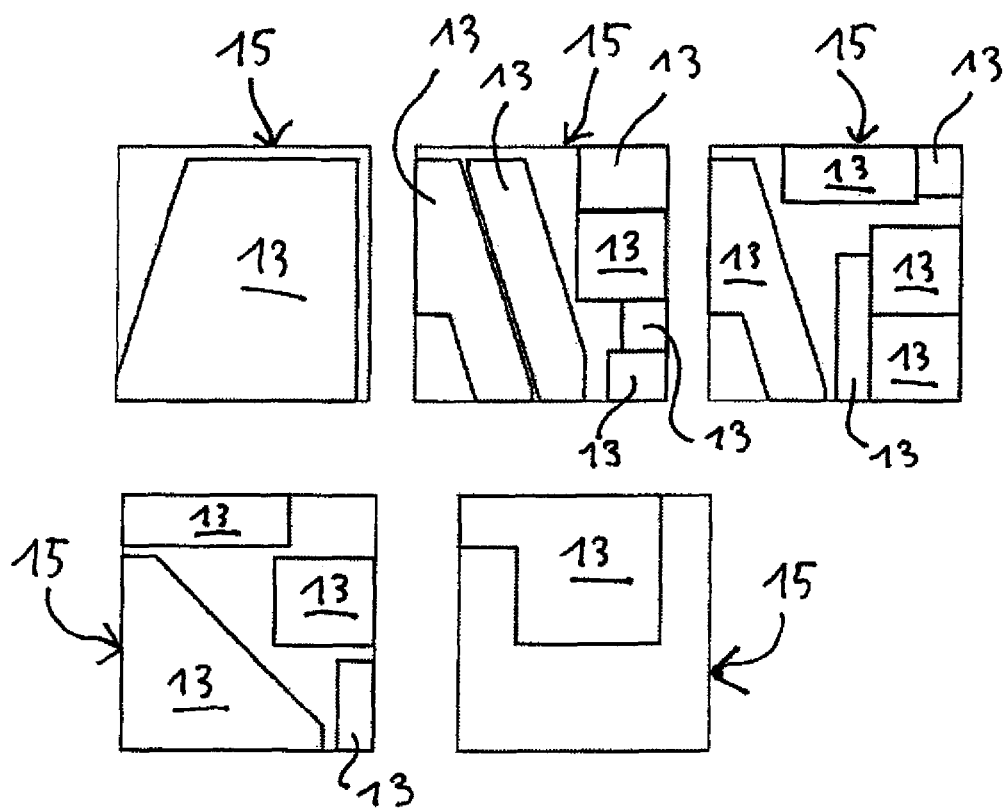
FIG. 3 is a plan view illustrating another plan for cutting out preforms.

Referring now in detail to the figures of the drawings, with which the invention will be described in greater detail on the basis of an explanatory but non-limiting example thereof, and first, particularly, to FIGS. 1A-1D thereof, there is seen a housing with dimensions of 1,150 mm×600 mm×390 mm which is intended for use in optical lithography and which was manufactured from a ceramic component. First, the housing was divided into four separate segments 11A-11D according to a previously defined joint definition system. The segments are shown in FIGS. 1A-1D. Dividing the housing into a plurality of segments 11A-11D helps to reduce the degree of complexity. Then, each of the segments 11A-11D is divided into a plurality of panel-like sub-segments 13. These sub-segments 13 were cut out of starting panels 15 made from a carbon composite material or milled at an angle and with a predefined surface constitution according to a plan as illustrated in FIGS. 2 and 3.

In order to produce starting panels 15, a carbonized mixture of cellulose flour and phenolic resin was molded into panel-like slabs, and the slabs were then compacted to a density of 0.74 g/cm$^3$ in a succession of compacting cycles. The cellulose flour contained carbon fibers, with the average length of the carbon fibers being not more than 50 μm. Then, starting panels 15 were carbonized at a temperature of 900° C. and graphitized at a temperature of 2000° C. Thereafter, sub-segments 13 were cut out of starting panels 15 in the C/C state.

In the next step, corresponding joining surfaces were coated with a pretreatment compound to reduce the absorbency of the green state carbon composite material of sub-segments 13. The pretreatment compound cured at room temperature. After curing of the pretreatment compound, a joining compound was applied to the joining surfaces using a spatula. Both the pre-treatment compound and the joining compound contained 20% by weight of water, 50% by weight of silicon carbide and 30% by weight of phenolic resin. The silicon carbide was in powder form and had an average particle diameter of 20 μm. p-toluenesulfonic acid was added as a curing agent immediately before each application of the pretreatment compound and the joining compound.

The individual sub-segments 13 were pressed against each other with a defined pressure of 1 MPa at the appropriate joining surfaces using non-illustrated clamping devices immediately after application of the joining compound. The clamping devices must be constructed in such a manner that they do not damage the green state carbon composite material of sub-segments 13. Subsequently, the joining compound was cured at room temperature for a period of 12 hours.

When the segments 11A-11D had been manufactured as the respective composites of sub-segments 13 in this manner, inclined joining surfaces of a first segment 11A and a second segment 11B were milled, and the segments 11A, 11B were joined using a pretreatment compound and joining compound as in the previously described joining of sub-segments 13 and with the aid of a non-illustrated chamfered retaining holding device. This approach permits any desired orientation of the starting plates 15 and thus the capability of saving material and reducing joining surfaces.

After the joining compound cured on the inclined joining surfaces, a third segment 11C and a fourth segment 11D were joined to the composite formed of the first segment 11A and the second segment 11B at further milled joining surfaces. In this context, centering may generally be assured using angle geometries or with the aid of locating ridges, which are milled off after bonding. In this way, in particular undesirable air pockets, such as occur with a register pin connection, for example, can be avoided.

After re-hardening of the joining compound, the tolerance-defined dimensions were machined again on the assembled segments 11A-11D to achieve the required tolerances. After machining of the composite in the green state, the composite was siliconized by infiltrating liquid silicon into the composite for a period of 1 hour at a temperature of 1680° C.

Upon completion of the siliconization process, a housing component made from a silicon carbide ceramic was obtained with largely homogeneous and isotropic material properties despite its size. In this particular case, shrinkage during manufacture of the component was 0.14% and the tolerance was ±0.2 mm per 1000 mm. Variation in the material properties such as density, thermal expansion, modulus of elasticity and flexure strength considered for the component as a whole did not exceed 3%.

The invention claimed is:

1. A method for manufacturing a component, the method comprising the following steps:
    a) providing each of at least two preforms from a carbon composite material;
    b) providing a joining compound containing silicon carbide and at least one polymer adhesive and connecting the at least two preforms at least at one joining surface of each of the at least two preforms to form a composite by introducing the joining compound between the joining surfaces of the at least two preforms and then curing the joining compound, the joining compound containing:
        15 to 25% by weight of water,
        45 to 55% by weight of silicon carbide, and
        27 to 33% by weight of polymer adhesive; and
    c) siliconizing the composite to produce the component.

2. The method according to claim 1, wherein the component is a ceramic component.

3. The method according to claim 1, which further comprises carrying out step b) by applying the joining compound to a joining surface of a preform to coat the joining surface, pressing the coated joining surface against the joining surface of another preform, and then curing the joining compound.

4. The method according to claim 1, which further comprises carrying out step b) by aligning the at least two preforms to be connected relative to each other to form a bonding gap between the joining surfaces, then filling the bonding gap with the joining compound, and then curing the joining compound.

5. The method according to claim 4, which further comprises carrying out the step of aligning the at least two preforms with a joining device.

6. The method according to claim 1, which further comprises providing the at least one polymer adhesive in step b) by using a joining material including at least one of a phenolic resin or at least one of a carbon-free polymer, a polysiloxane or a polysilazane.

7. The method according to claim 1, wherein the at least one polymer adhesive in step b) includes a polysilane carbon-free polymer.

8. The method according to claim 1, which further comprises carrying out step b) by using a joining compound containing a curing agent for the at least one polymer adhesive.

9. The method according to claim 8, wherein the curing agent contains a base or an acid or p-toluenesulfonic acid.

10. The method according to claim 1, which further comprises carrying out step b) by curing the joining compound at one of the following temperature ranges:
    10° C. to 100° C., or
    15° C. to 80° C., or
    18° C. to 30° C.

11. The method according to claim 10, which further comprises carrying out the curing step for a period of 5 to 30 hours.

12. The method according to claim 1, which further comprises carrying out step b) by using a joining compound containing silicon carbide in powder form and having an average particle diameter in one of the following ranges:
    1 to 50 μm, or
    3 to 20 μm, or
    5 to 10 μm.

13. The method according to claim 1, which further comprises carrying out step a) by providing the at least two preforms from a composite material including a matrix of amorphous and porous carbon.

14. The method according to claim 13, which further comprises carrying out step a) by providing two preforms containing at least one of carbon particles or carbon fibers embedded in the matrix, and providing the carbon particles with a particle diameter or providing the carbon fibers with an average length, not exceeding 75 μm.

15. The method according to claim 14, wherein the particle diameter or the average length does not exceed 50 μm.

16. A method for manufacturing a component, the method comprising the following steps:
    a) providing each of at least two preforms from a composite material including a matrix of amorphous and porous carbon by molding the at least two preforms from a mixture containing a carbon precursor and an organic binder, subsequently carbonizing the at least two preforms, and using cellulose flour as the carbon precursor;

b) providing a joining compound containing silicon carbide and at least one polymer adhesive and connecting the at least two preforms at least at one joining surface of each of the at least two preforms to form a composite by introducing the joining compound between the joining surfaces of the at least two preforms and then curing the joining compound; and c) siliconizing the composite to produce the component.

17. The method according to claim 1, which further comprises carrying out step b) by applying a pretreatment compound to the joining surfaces of the at least two preforms before applying the joining compound.

18. The method according to claim 17, wherein the pretreatment compound includes silicon.

19. The method according to claim 18, wherein the pretreatment compound is composed of the same components as the joining compound.

20. The method according to claim 1, which further comprises carrying out the siliconizing in step c) by infiltrating the composite with liquid silicon or a liquid silicon alloy and subsequently heat treating at a temperature in one of the following ranges:

1,100 to 2000° C., or
1,350 to 2000° C., or
1,500° C. to 1,700° C.

* * * * *